(12) United States Patent
Shimoida et al.

(10) Patent No.: US 9,048,103 B2
(45) Date of Patent: Jun. 2, 2015

(54) METHOD FOR PRODUCING SEMICONDUCTOR DEVICE

(75) Inventors: Yoshio Shimoida, Yokosuka (JP);
Hideaki Tanaka, Yokohama (JP);
Tetsuya Hayashi, Yokosuka (JP);
Masakatsu Hoshi, Yokohama (JP);
Shigeharu Yamagami, Yokohama (JP);
Noriaki Kawamoto, Kyoto (JP);
Takayuki Kitou, Kameoka (JP); Mineo Miura, Kyoto (JP); Takashi Nakamura, Nagaokakyo (JP)

(73) Assignees: NISSAN MOTOR CO., LTD., Kanagawa-Ken (JP); ROHM CO., LTD., Kyoto-Fu (JP)

( * ) Notice: Subject to any disclaimer, the term of this patent is extended or adjusted under 35 U.S.C. 154(b) by 1295 days.

(21) Appl. No.: 11/988,305

(22) PCT Filed: Jun. 26, 2006

(86) PCT No.: PCT/JP2006/313167
§ 371 (c)(1),
(2), (4) Date: Sep. 10, 2008

(87) PCT Pub. No.: WO2007/004595
PCT Pub. Date: Jan. 11, 2007

(65) Prior Publication Data
US 2009/0026497 A1 Jan. 29, 2009

(30) Foreign Application Priority Data

Jul. 5, 2005 (JP) ................................. 2005-196533

(51) Int. Cl.
*H01L 21/336* (2006.01)
*H01L 21/3105* (2006.01)
(Continued)

(52) U.S. Cl.
CPC ........... *H01L 21/049* (2013.01); *H01L 29/1608* (2013.01); *H01L 29/267* (2013.01); *H01L 29/66068* (2013.01); *H01L 29/772* (2013.01); *H01L 29/7828* (2013.01)

(58) Field of Classification Search
USPC .......................... 438/775; 257/327, E21.302
See application file for complete search history.

(56) References Cited

U.S. PATENT DOCUMENTS 5,733,810 A * 3/1998 Baba et al. .................... 438/268
6,096,641 A * 8/2000 Kunikiyo ...................... 438/653
(Continued)

FOREIGN PATENT DOCUMENTS

CN 1606140 4/2005
CN 1632922 6/2005
(Continued)

OTHER PUBLICATIONS

Argawal, A., et al., "Large Area 4H-SiC Power MOSFETs", Proceeding of 2001 International Symposium on Power Semiconductor Devices & ICs, 2001, pp. 183-186, Osaka, Japan.
(Continued)

*Primary Examiner* — Earl Taylor
(74) *Attorney, Agent, or Firm* — McDermott Will & Emery LLP

(57) ABSTRACT

A method for producing a semiconductor device (20) is disclosed. The semiconductor device (20) includes: 1) a semiconductor substrate (1, 2), 2) a hetero semiconductor area (3) configured to contact a first main face (1A) of the semiconductor substrate (1, 2) and different from the semiconductor substrate (1, 2) in band gap, 3) a gate electrode (7) contacting, via a gate insulating film (6), a part of a junction part (13) between the hetero semiconductor area (3) and the semiconductor substrate (1, 2), 4) a source electrode (8) configured to connect to the hetero semiconductor area (3), and 5) a drain electrode (9) configured to make an ohmic connection with the semiconductor substrate (1, 2). The method includes the following sequential operations: i) forming the gate insulating film (6); and ii) nitriding the gate insulating film (6).

7 Claims, 7 Drawing Sheets

(51) Int. Cl.
*H01L 29/78* (2006.01)
*H01L 21/04* (2006.01)
*H01L 29/267* (2006.01)
*H01L 29/66* (2006.01)
H01L 29/16 (2006.01)
H01L 29/772 (2006.01)

(56) References Cited

U.S. PATENT DOCUMENTS

| | | | |
|---|---|---|---|
| 6,437,371 B2* | 8/2002 | Lipkin et al. | 257/77 |
| 6,452,228 B1* | 9/2002 | Okuno et al. | 257/329 |
| 6,528,373 B2* | 3/2003 | Lipkin et al. | 438/287 |
| 6,610,615 B1* | 8/2003 | McFadden et al. | 438/776 |
| 6,667,251 B2* | 12/2003 | McFadden et al. | 438/795 |
| 6,767,843 B2* | 7/2004 | Lipkin et al. | 438/758 |
| 6,847,079 B2* | 1/2005 | Nakamura | 257/77 |
| 6,864,507 B2* | 3/2005 | Yokogawa et al. | 257/77 |
| 6,921,703 B2* | 7/2005 | Bevan et al. | 438/287 |
| 7,180,131 B2* | 2/2007 | Nakamura | 257/330 |
| 7,221,010 B2* | 5/2007 | Ryu | 257/287 |
| 7,229,882 B2* | 6/2007 | Nakamura | 438/259 |
| 7,414,268 B2* | 8/2008 | Ryu et al. | 257/77 |
| 7,473,929 B2* | 1/2009 | Kusumoto et al. | 257/77 |
| 7,538,352 B2* | 5/2009 | Fukuda et al. | 257/77 |
| 7,867,860 B2* | 1/2011 | Huang et al. | 438/285 |
| 2001/0048115 A1* | 12/2001 | Yamazaki et al. | 257/154 |
| 2002/0038891 A1* | 4/2002 | Ryu et al. | 257/350 |
| 2002/0102358 A1* | 8/2002 | Das et al. | 427/376.2 |
| 2002/0121661 A1* | 9/2002 | Nakamura | 257/328 |
| 2003/0073270 A1* | 4/2003 | Hisada et al. | 438/197 |
| 2003/0227061 A1* | 12/2003 | Yokogawa et al. | 257/379 |
| 2004/0101625 A1* | 5/2004 | Das et al. | 427/378 |
| 2004/0217358 A1* | 11/2004 | Kaneko | 257/77 |
| 2004/0229475 A1* | 11/2004 | Bevan et al. | 438/765 |
| 2005/0012143 A1* | 1/2005 | Tanaka et al. | 257/328 |
| 2005/0026406 A1* | 2/2005 | Hao et al. | 438/585 |
| 2005/0064639 A1* | 3/2005 | Hisada et al. | 438/197 |
| 2005/0082522 A1* | 4/2005 | Huang et al. | 257/19 |
| 2005/0093061 A1* | 5/2005 | Nakamura | 257/330 |
| 2005/0116360 A1* | 6/2005 | Huang et al. | 257/900 |
| 2005/0139838 A1* | 6/2005 | Murata et al. | 257/73 |
| 2005/0151188 A1* | 7/2005 | Nakamura | 257/330 |
| 2006/0199324 A1* | 9/2006 | Yu et al. | 438/199 |
| 2006/0261347 A1* | 11/2006 | Ryu et al. | 257/77 |
| 2009/0026497 A1* | 1/2009 | Shimoida et al. | 257/192 |

FOREIGN PATENT DOCUMENTS

| | | | |
|---|---|---|---|
| JP | 2003-318398 | 11/2003 | |
| JP | 2005-101148 | 4/2005 | |
| KR | 10-2003-0064763 A | 8/2003 | |
| TW | 546836 | 8/2003 | |
| WO | WO 02/29900 A2 | 4/2002 | |
| WO | WO 2007004595 A2 * | 1/2007 | H01L 21/04 |

OTHER PUBLICATIONS

Korean Notice of Preliminary Rejection, w/ English translation thereof, issued in Korean Patent Application No. 10-2008-7002933 dated Jun. 29, 2009.

Chinese Office Action issued in Chinese Patent Application No. CN 2006800245125, dated Jul. 24, 2009.

Chinese Office Action issued in Chinese Patent Application No. 200680024512.5, mailed Jul. 16, 2010.

Taiwanese Office Action, with English translation, issued in Taiwanese Patent Application No. TW 95124523, mailed Nov. 10, 2008.

G.Y. Chung et al., Improved Inversion Channel Mobility for 4H-SiC MOSFETs Following High Temperature Anneals in Nitric Oxide, IEEE Electron Device Letters, Apr. 2001, vol. 22, No. 4, 176-178.

Reinhold Schorner et al., Enhanced channel Mobility of 4H-SiC metal-oxide-semiconductor transistors fabricated with standard polycrystalline silicon technology and gate-oxide nitridation, Applied Physics Letters, Jun. 3, 2002, vol. 80, No. 22, 4253-4255.

Japanese Notification of Reasons for Refusal, and English translation thereof, issued in Japanese Patent Application No. 2005-196533 dated Nov. 29, 2011.

Chung et al., "Effect of Nitric Oxide Annealing on the Interface Trap Densities Near the Band Edges in the 4H Polytype of Silicon Carbide," Applied Physics Letters, 76(13): 1713-1715 (2000).

* cited by examiner

METHOD FOR PRODUCING SEMICONDUCTOR DEVICE

RELATED APPLICATIONS

This application is the U.S. National Phase under 35 U.S.C. §371 of International Application No. PCT/JP2006/313167, filed on Jun. 26, 2006, which in turn claims the benefit of Japanese Application No. 2005-196533, filed on Jul. 5, 2005, the disclosures of which Applications are incorporated by reference herein.

TECHNICAL FIELD

The present invention relates to a method for producing a semiconductor device.

BACKGROUND ART

Japanese Patent Application Laid-Open No. 2003-318398 (JP2003318398) sets forth a conventional silicon carbide semiconductor device which is a field effect transistor using a hetero interface. In JP2003318398, a voltage applied to a gate electrode 40 controls barrier thickness of the hetero interface, passing a carrier by a tunnel current when an element is ON. JP2003318398 features a device structure which is free from a channel area such as MOSFET and is unlikely to be influenced by high channel resistance, realizing a power semiconductor switch featuring high voltage capability and low ON resistance.

DISCLOSURE OF THE INVENTION

It is an object of the present invention to provide a method for producing a semiconductor device featuring low ON resistance and high voltage capability with low inverse leak current.

According to a first aspect of the present invention, there is provided a method for producing a semiconductor device which includes: 1) a semiconductor substrate, 2) a hetero semiconductor area configured to contact a first main face of the semiconductor substrate and different from the semiconductor substrate in band gap, 3) a gate electrode contacting, via a gate insulating film, a part of a junction part between the hetero semiconductor area and the semiconductor substrate, 4) a source electrode configured to connect to the hetero semiconductor area, and 5) a drain electrode configured to make an ohmic connection with the semiconductor substrate, the method comprising the following sequential operations: i) forming the gate insulating film; and ii) nitriding the gate insulating film.

According to a second aspect of the present invention, there is provided a semiconductor device, comprising: 1) a semiconductor substrate; 2) a hetero semiconductor area configured to contact a first main face of the semiconductor substrate and different from the semiconductor substrate in band gap; 3) a gate insulating film produced by the following sequential operations: i) forming the gate insulating film, and ii) nitriding the gate insulating film; 4) a gate electrode contacting, via the gate insulating film, a part of a junction part between the hetero semiconductor area and the semiconductor substrate; 5) a source electrode configured to connect to the hetero semiconductor area; and 6) a drain electrode configured to make an ohmic connection with the semiconductor substrate.

The other and further features, advantages and benefits of the present invention will become apparent from the following description in conjunction with the following drawings.

BEST MODE FOR CARRYING OUT THE INVENTION

Hereinafter, the present invention is to be set forth in detail, according to embodiments of the present invention.

First Embodiment

Figure 1:
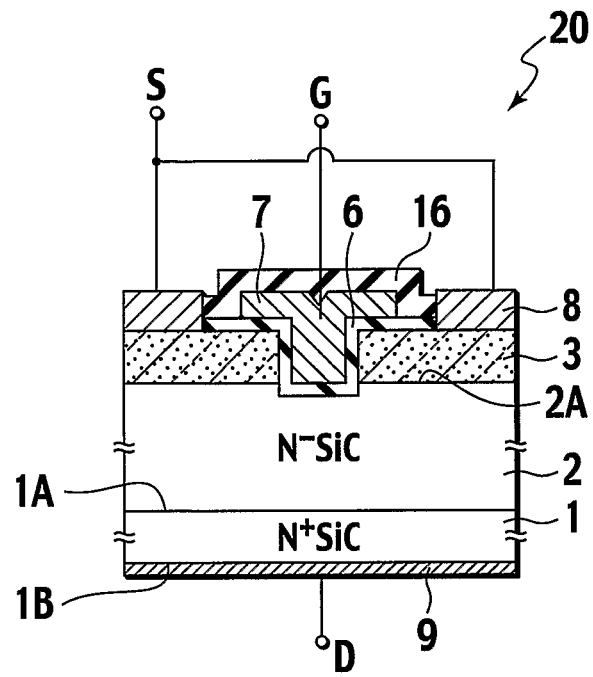
FIG. 1 a cross sectional view of a device structure, according to a first embodiment of the present invention.

A first embodiment of the present invention is to be set forth referring to FIG. 1 to FIG. 4.
<Structure>
FIG. 1 shows a cross sectional structure of a field effect transistor produced by a method for producing a semiconductor device 20, according to the first embodiment of the present invention, where two unit cells are opposed. Actually, a plurality of the unit cells are connected in parallel to form an element. Hereinafter, however, the above cross sectional structure is to be set forth typically.

At first, in terms of structure, an $N^+$ high density SiC substrate area 1 has a first main face on which an $N^-$ low density SiC drain area 2 is formed. The $N^-$ SiC drain area 2 includes an epitaxial layer grown on the $N^+$ SiC substrate area 1. SiC includes several poly-types (crystal polymorphism). Hereinafter set forth is, however, an SiC as a typical 4H—SiC. Of course, other types of SiCs such as 6H—SiC, 3C—SiC and the like can replace the 4H—SiC. FIG. 1 omits detailed concept of thickness of the $N^+$ SiC substrate area 1 and of the $N^-$ SiC drain area 2. Specifically, the $N^+$ SiC substrate area 1 has a thickness of several hundreds of micrometers while the $N^-$ SiC drain area 2 has a thickness of several micrometers to ten-plus micrometers. The $N^+$ SiC substrate area 1 and the $N^-$ SiC drain area 2 in combination form a structural element of a semiconductor substrate.

The $N^-$ SiC drain area 2 has a first main face 2A formed with a hetero semiconductor area 3 made of polycrystal silicon, where the hetero semiconductor area 3 contacting the first main face 2A is different from the semiconductor substrate 1, 2 in band gap. The SiC and the polycrystal silicon are different from each other in band gap and electron affinity. An interface between the SiC (of the $N^-$ SiC drain area 2) and the polycrystal silicon (of the hetero semiconductor area 3) forms a hetero junction 13 (this is why the polycrystal silicon is referred to as hetero semiconductor area). Moreover, a gate electrode 7 contacts, via a gate insulating film 6, a junction part (or hetero junction 13) between the N⁻ SiC drain area 2 and the hetero semiconductor area 3. The hetero semiconductor area 3 connects to a source electrode 8; while the N⁺ SiC substrate area 1 has a back face 1B which makes an ohmic connection with the drain electrode 9, featuring an electrically low resistance. By means of a layer-to-layer insulating film 16, the gate electrode 7 is insulated from the source electrode 8.

Figure 2:
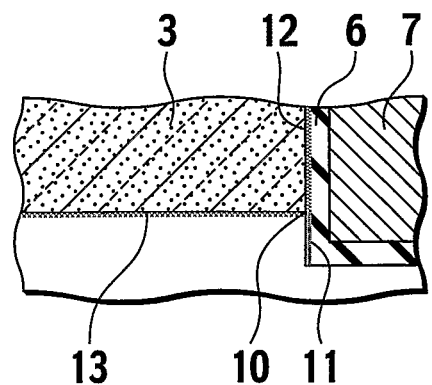
FIG. 2 is an enlarged view showing an interface between a gate insulating film and an $N^-$ SiC drain area, an interface between the gate insulating film and a hetero semiconductor area, and an interface between the hetero semiconductor area and the $N^-$ SiC drain area.

FIG. 2 is an enlarged view showing an interface 11 between the gate insulating film 6 and the N⁻ SiC drain area 2 (interface between $SiO_2$ and SiC), an interface 12 between the gate insulating film 6 and the hetero semiconductor area 3 (interface between $SiO_2$ and poly-Si), and an interface 13 (or hetero junction 13) between the N⁻ SiC drain area 2 and the hetero semiconductor area 3 (interface between SiC and poly-Si). Hereinabove, "poly-Si" denotes polysilicon, in other words, polycrystal silicon. The three different interfaces 11, 12 and 13 in combination define a drive point 10. When the element is ON, a tunnel current flows in the vicinity of the drive point 10.

The structure set forth hitherto according to the first embodiment of the present invention is substantially like the one according to the conventional technology. Fundamental ON and OFF operations according to the first embodiment are substantially the same as those according to the conventional technology. The first embodiment of the present invention features a method for producing the semiconductor device 20, specifically, nitriding the gate insulating film 6 after forming the gate insulating film 6. According to the first embodiment, the nitriding includes high temperature heat treatment (high temperature annealing) in an atmosphere containing $N_2O$. Moreover, for the high temperature annealing in the atmosphere containing nitride, the above nitriding can use a nitride which is at least one selected from the group consisting of $N_2O$, NO and $NO_x$.

<Method>

Hereinafter, a method for producing the field effect transistor is to be set forth referring to FIG. 3 and FIG. 4, according to the first embodiment of the present invention.

Figure 3:
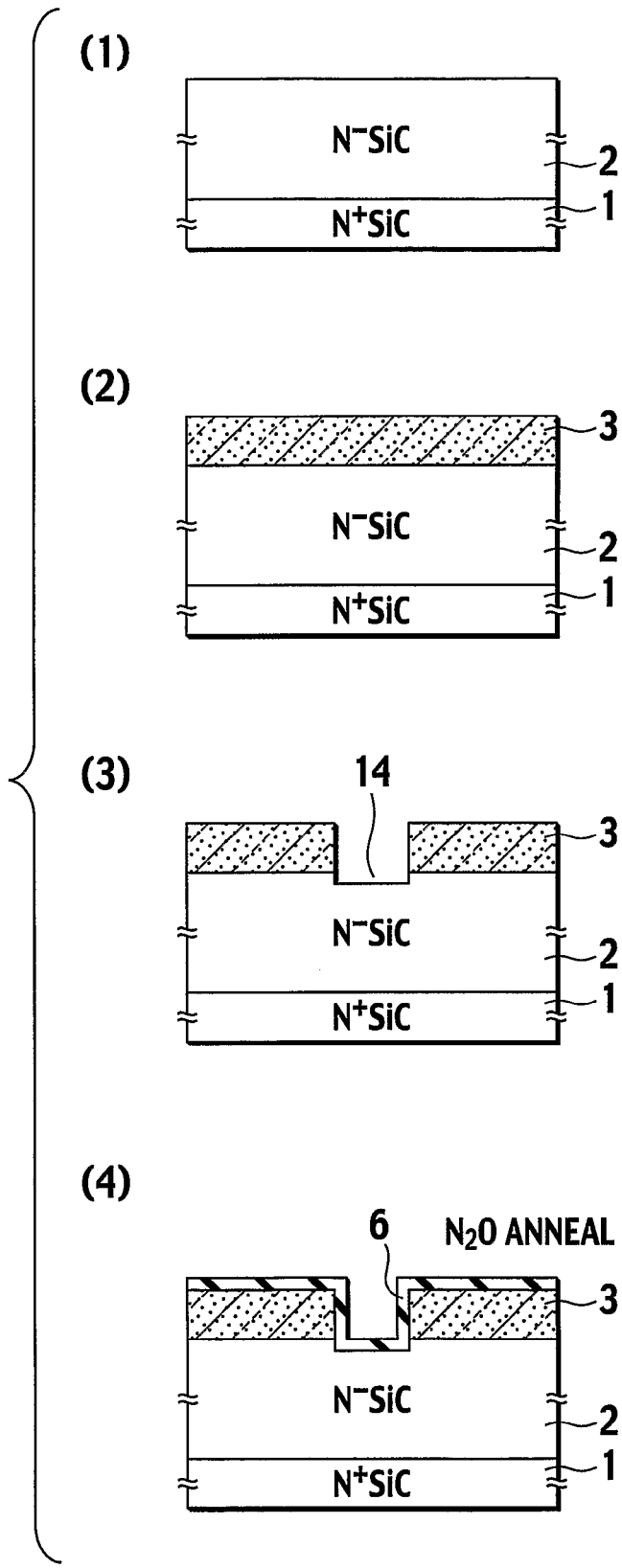
FIG. 3 shows operations, according to the first embodiment of the present invention.

FIG. 3-(1) shows that the N⁻ low density SiC drain area 2 is formed, having the epitaxial layer grown on the first main face 1A of the N⁺ high density SiC substrate area 1.

FIG. 3-(2) shows that the N⁻ SiC drain area 2's surface (including the first main face 2A) is cleaned by a pretreatment and the like, followed by depositing the hetero semiconductor area 3 made of the polycrystal silicon. Herein, by means of an ion implantation and the like, an impurity is introduced to the hetero semiconductor area 3 to thereby make the N⁺ hetero semiconductor area 3.

FIG. 3-(3) shows that a part of the hetero semiconductor area 3 is etched for forming the gate electrode 7. The thus etched dent is referred to as an etched part 14. In FIG. 3-(3), in combination with the hetero semiconductor area 3 thus etched, the N⁻ SiC drain area 2's surface is partly etched. This partly etching of the N⁻ SiC drain area 2's surface can be, however, omitted.

FIG. 3-(4) shows that the gate insulating film 6 made of silicon oxide film (silicon dioxide film) is deposited by a thickness from several hundreds of angstroms to several thousands of angstroms. The depositing of the gate insulating film 6 made of silicon oxide film (silicon dioxide film) is free from heat oxidizing of the semiconductor substrate 1, 2 and the like, examples of the above depositing method including chemical vapor deposition.

According to the first embodiment of the present invention, then, the high temperature annealing is implemented in the atmosphere containing $N_2O$ at a temperature, for example, 900° C. to 1,300° C. for several tens of minutes to several hours.

Figure 4:
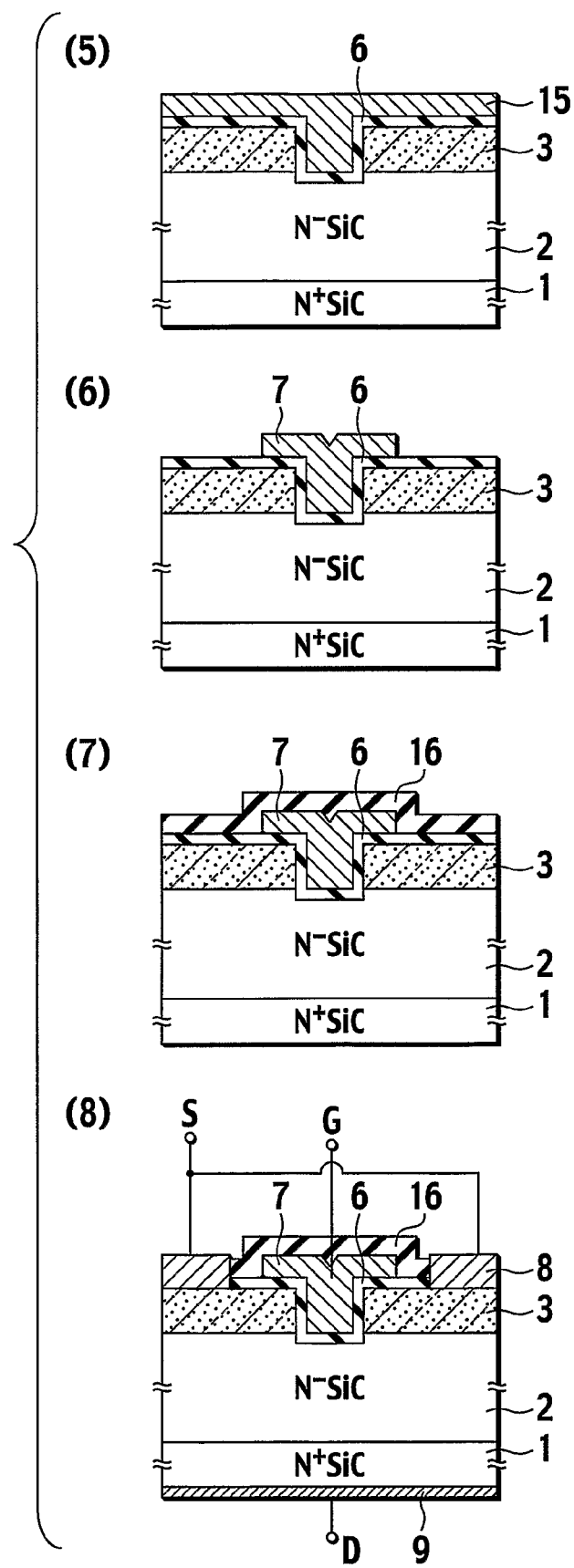
FIG. 4 shows continued operations of those in FIG. 3, according to the first embodiment of the present invention.

FIG. 4-(5) shows that a polycrystal silicon layer 15 is deposited for forming the gate electrode 7 on the gate insulating film 6. The polycrystal silicon layer 15 has thickness varied with the thickness of the hetero semiconductor area 3. According to the first embodiment, however, the polycrystal silicon layer 15 is so adjusted in thickness that the gate electrode 7 can sufficiently fill the etched part 14.

FIG. 4-(6) shows that the gate electrode 7 is patterned into a desired form.

FIG. 4-(7) shows that the layer-to-layer insulating film 16 is so formed as to cover the element.

FIG. 4-(8) shows that the layer-to-layer insulating film 16 is caused to partly have a contact hole, allowing the source electrode 8 made of metal and the like to connect with the hetero semiconductor area 3 at electrically low resistance. Moreover, on the entire back face 1B of the N⁺ SiC substrate area 1, the drain electrode 9 made of metal and the like is so formed as to make the ohmic connection featuring low resistance.

With the above operations, the production of the field effect transistor is thus completed, according to the first embodiment.

<Operation and Effect>

Hereinafter set forth are operations and effects of the field effect transistor produced by the method, according to the first embodiment of the present invention. When a voltage applied to the gate electrode 7 based on the source electrode 8 is less than or equal to a threshold, the element is OFF. When a high voltage less than or equal to the element's withstanding voltage is applied to the drain electrode 9, a hetero interface between the N⁺ hetero semiconductor area 3 and the N⁻ SiC drain area 2 which interface having a barrier prevents the current between the drain electrode 9 and the source electrode 8, thus keeping the voltage capability. The voltage applied across the drain electrode 9 and the source electrode 8 may extend a depletion layer to the N⁻ SiC drain area 2. Height of the barrier varies with band strut of the hetero junction 13, depending on the polycrystal silicon's Fermi level, in other words, impurity density of the hetero semiconductor area 3. According to the first embodiment, the preferable OFF property according to the conventional technology can be achieved as it is.

When the voltage applied to the gate electrode 7 based on the source electrode 8 is more than or equal to the threshold, the element is ON. When the barrier thickness at the drive point 10 is decreased by the electric field from the gate electrode 7 thereby passing the carrier by means of the tunnel current, the current flows between the drain electrode 9 and the source electrode 8 via the drive point 10. Then, in the vicinity of the drive point 10, the current flows along the interface 11 between the gate insulating film 6 and the N⁻ SiC drain area 2, and along the interface 12 between the gate insulating film 6 and the hetero semiconductor area 3.

The high temperature annealing in the atmosphere containing $N_2O$ can dramatically decrease the interface level of each of the interface 11, the interface 12 and the interface 13, thus improving electron mobility on the interfaces 11, 12 and 13 in the vicinity of the drive point 10, realizing the field effect transistor featuring low ON resistance. Moreover, as a unique effect of the present invention, the high temperature annealing in the atmosphere containing $N_2O$ can decrease the interface level at the hetero junction 13 between the hetero semiconductor area 3 (the polycrystal silicon) and the $N^-$ SiC drain area 2, thus improving electron mobility.

Results of hard research and experimentation by the present invention show that the high temperature annealing in the atmosphere containing $N_2O$ can greatly improve the drive force (in other words, ON resistance is decreased).

As set forth above, according to the first embodiment, after forming of the gate insulating film 6, the high temperature annealing of the gate insulating film 6 in the atmosphere containing $N_2O$ can improve the electron mobility on the three interfaces 11, 12 and 13 in the vicinity of the drive point 10, which is the unique effect of the present invention, thus producing the field effect transistor featuring low ON resistance.

Second Embodiment

Figure 5:
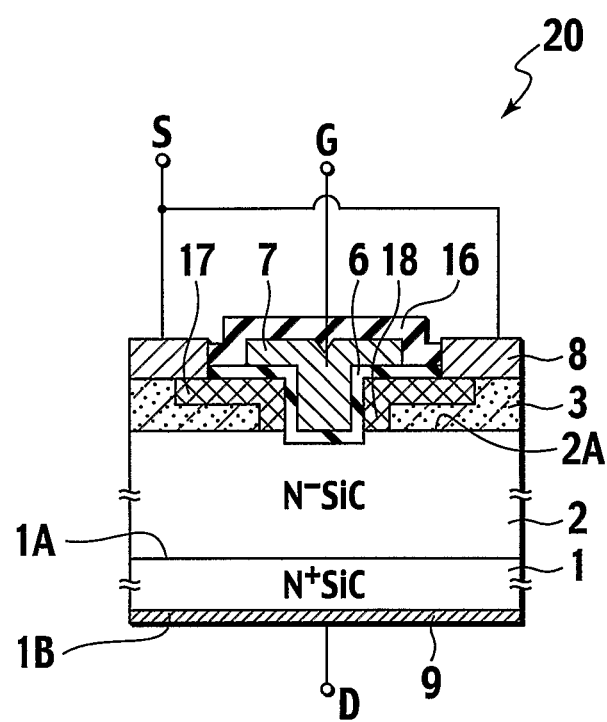
FIG. 5 a cross sectional view of a device structure, according to a second embodiment of the present invention.

A second embodiment of the present invention is to be set forth referring to FIG. 5 to FIG. 8.
<Structure>
FIG. 5 shows a cross sectional structure of the field effect transistor produced by a method for producing the semiconductor device 20, according to the second embodiment of the present invention. Like the structure in FIG. 1 according to the first embodiment, two unit cells are opposed in FIG. 5 according to the second embodiment. The fundamental structural elements in FIG. 5 are substantially the same as those in FIG. 1, therefore different structural elements are to be set forth. The $N^-$ SiC drain area 2 has the first main face 2A formed with the hetero semiconductor area 3 made of polycrystal silicon. Herein, an impurity is introduced to the hetero semiconductor area 3 to thereby make the $P^+$ hetero semiconductor area 3, and there is formed an $N^+$ source drawing area 17 having a surface contacting the source electrode 8. A part contacting the gate insulating film 6 is formed with an $N^+$ hetero semiconductor area 18, connecting with the source electrode 8 via the $N^+$ source drawing area 17.
<Method>
Hereinafter, the method for producing the field effect transistor is set forth referring to FIG. 6 to FIG. 8, according to the second embodiment of the present invention.

Figure 6:
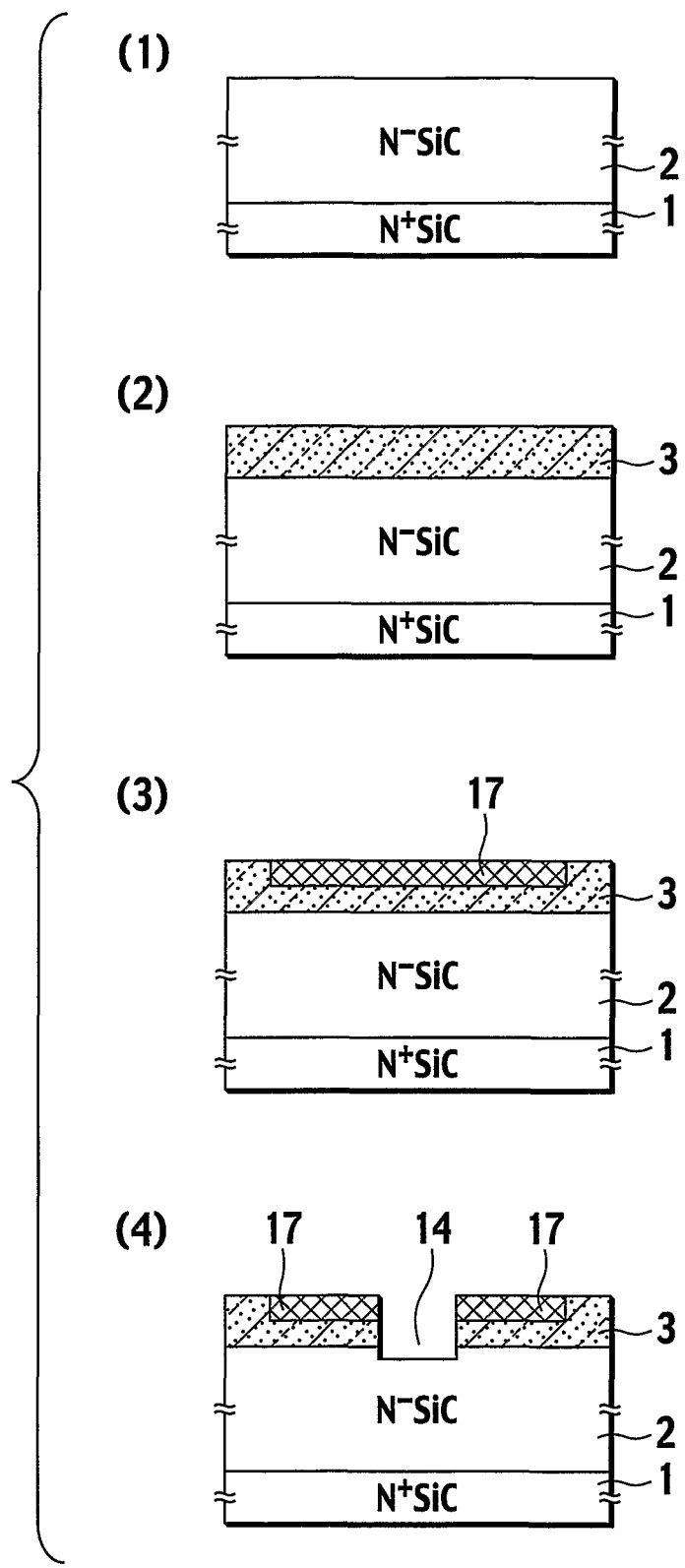
FIG. 6 shows operations, according to the second embodiment of the present invention.

FIG. 6-(1) shows that the $N^-$ low density SiC drain area 2 is formed, having the epitaxial layer grown on the first main face 1A of the $N^+$ high density SiC substrate area 1.

FIG. 6-(2) shows that the $N^-$ SiC drain area 2's surface (including the first main face 2A) is cleaned by a pretreatment and the like, followed by depositing the hetero semiconductor area 3 made of the polycrystal silicon. Herein, by means of an ion implantation and the like, an impurity such as boron ($B^+$) is introduced to the hetero semiconductor area 3 to make the $P^+$ hetero semiconductor area 3.

FIG. 6-(3) shows that, moreover, a patterning is implemented on a shallow area of the surface of the hetero semiconductor area 3 by a photolithography and the like, then, an impurity such as arsenic ($As^+$) is introduced to the source drawing area 17 to cause $N^+$.

FIG. 6-(4) shows that a part of the hetero semiconductor area 3 is etched for forming the gate electrode 7. The thus etched dent is referred to as the etched part 14. In FIG. 6-(4), in combination with the hetero semiconductor area 3 thus etched, the $N^-$ SiC drain area 2's surface is partly etched. This partly etching of the $N^-$ SiC drain area 2's surface can be, however, omitted.

Figure 7:
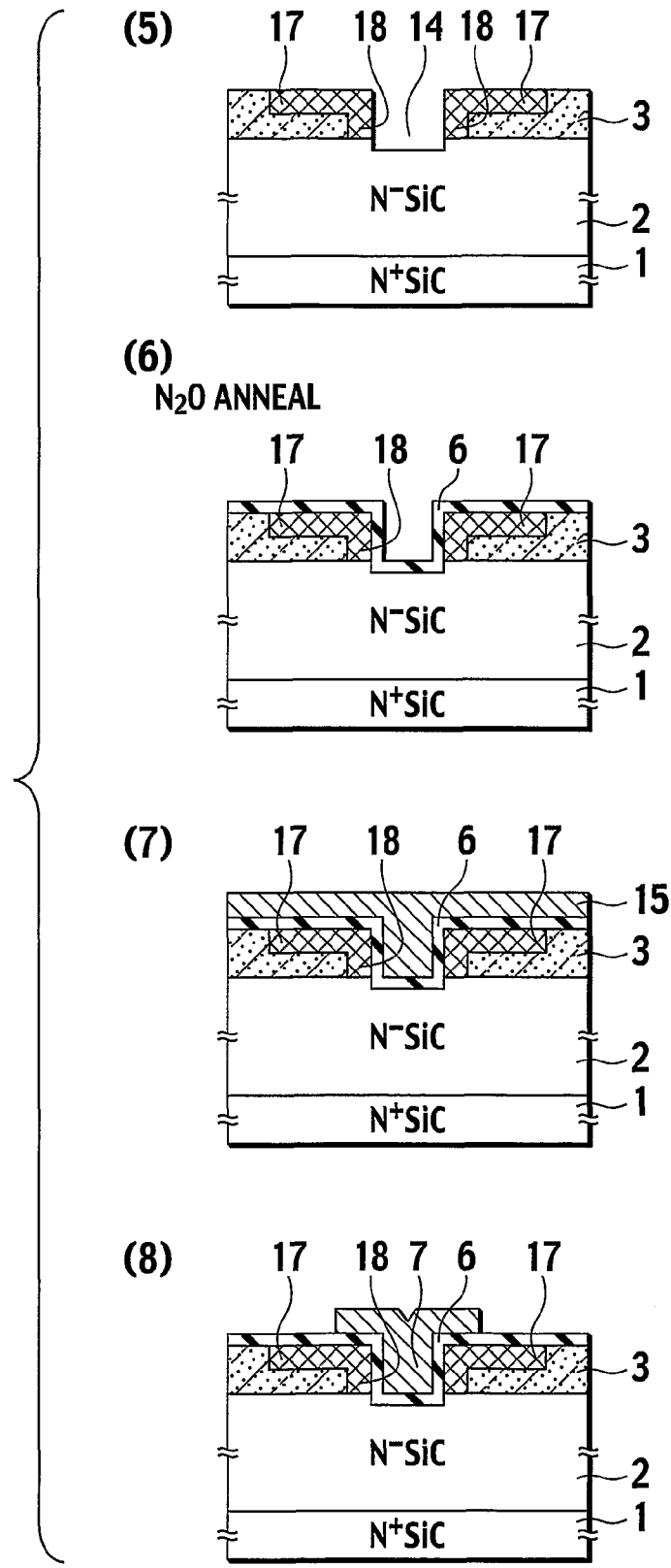
FIG. 7 shows continued operations of those in FIG. 6, according to the second embodiment of the present invention.

FIG. 7-(5) shows that along the etched part 14, the $N^+$ hetero semiconductor area 18 is formed laterally by impurity diffusion and the like of $As^+$ and the like.

FIG. 7-(6) shows that the gate insulting film 6 made of silicon oxide film (silicon dioxide film) is deposited by a thickness from several hundreds of angstroms to several thousands of angstroms. According to the second embodiment, then, the high temperature annealing is implemented in the atmosphere containing $N_2O$ at a temperature, for example, 900° C. to 1,300° C. for several tens.

FIG. 7-(7) shows that the polycrystal silicon layer 15 is deposited for forming the gate electrode 7 on the gate insulating film 6.

The polycrystal silicon layer 15 has thickness varied with the thickness of the hetero semiconductor area 3. According to the second embodiment, however, the polycrystal silicon layer 15 is so adjusted in thickness that the gate electrode 7 can sufficiently fill the etched part 14.

FIG. 7-(8) shows that the gate electrode 7 is patterned into a desired form.

Figure 8:
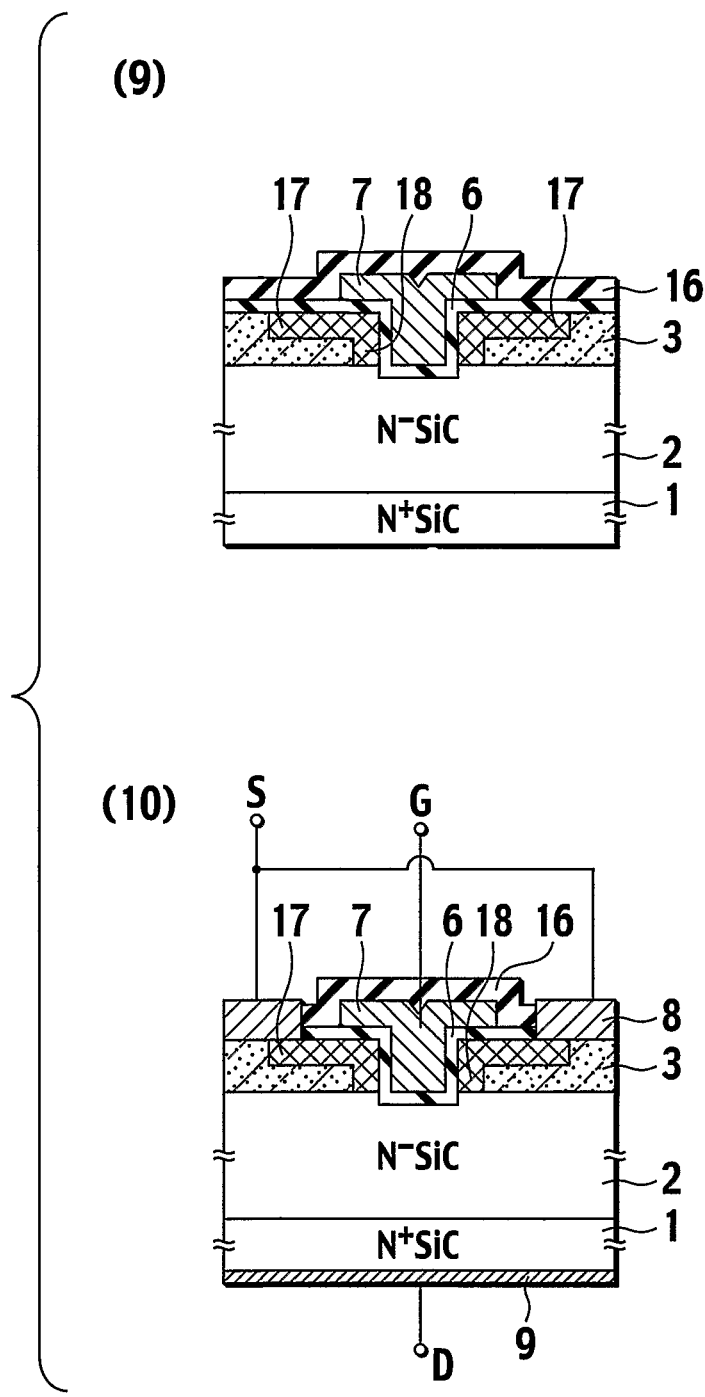
FIG. 8 shows further continued operations of those in FIG. 7, according to the second embodiment of the present invention.

FIG. 8-(9) shows that the layer-to-layer insulating film 16 is so formed as to cover the element.

FIG. 8-(10) shows that the layer-to-layer insulating film 16 is caused to partly have the contact hole, allowing the source electrode 8 made of metal and the like to connect with the hetero semiconductor area 3 and the $N^+$ source drawing area 17 at electrically low resistance. Moreover, on the entire back face 1B of the $N^+$ SiC substrate area 1, the drain electrode 9 made of metal and the like is so formed as to make the ohmic connection featuring low resistance.

With the above operations, the production of the field effect transistor is thus completed, according to the second embodiment.
<Operation and Effect>
Hereinafter set forth are operations and effects of the field effect transistor produced by the method, according to the second embodiment of the present invention. Fundamental effects according to the second embodiment are substantially the same as those set forth according to the first embodiment. When the voltage applied to the gate electrode 7 based on the source electrode 8 is less than or equal to a threshold, the element is OFF. When a high voltage less than or equal to the element's withstanding voltage is applied to the drain electrode 9, a hetero interface between the $P^+$ hetero semiconductor area 3 and the $N^-$ SiC drain area 2 has a barrier which is higher than that brought about by the $N^+$ hetero semiconductor area 3 and the $N^-$ SiC drain area 2 according to the first embodiment. The current does not flow between the drain electrode 9 and the source electrode 8, thus keeping high voltage capability.

When the voltage applied to the gate electrode 7 based on the source electrode 8 is more than or equal to the threshold, the element is ON. When the barrier thickness at the drive point 10 is decreased by the electric field from the gate electrode 7 thereby passing the carrier by means of the tunnel current, the current flows between the drain electrode 9 and the source electrode 8 via the drive point 10, the $N^+$ hetero semiconductor area 18 and the $N^+$ source drawing area 17. Then, in the vicinity of the drive point 10, the current flows along the interface 11 between the gate insulating film 6 and the $N^-$ SiC drain area 2, and along the interface 12 between the gate insulating film 6 and the $N^+$ hetero semiconductor area 18.

The high temperature annealing in the atmosphere containing $N_2O$ can dramatically decrease the interface level of each of the interface 11, the interface 12 and the interface 13, thus improving electron mobility on the interfaces 11, 12 and 13 in the vicinity of the drive point 10, realizing the field effect transistor featuring low ON resistance.

Moreover, as a unique effect of the present invention, the high temperature annealing in the atmosphere containing $N_2O$ can decrease the interface level at the hetero junction 13 between the hetero semiconductor area 3 (the polycrystal silicon) and the $N^-$ SiC drain area 2, thus improving electron mobility.

Results of hard research and experimentation by the present invention show that the high temperature annealing in the atmosphere containing $N_2O$ can greatly improve the drive force (in other words, ON resistance is decreased).

As set forth above, according to the second embodiment, after forming of the gate insulating film 6, the high temperature annealing of the gate insulating film 6 in the atmosphere containing $N_2O$ can improve the electron mobility on the three interfaces 11, 12 and 13 in the vicinity of the drive point 10, which is the unique effect of the present invention, thus producing the field effect transistor featuring high voltage capability and low ON resistance.

The entire contents of Japanese Patent Application No. 2005-196533 with its filing date of Jul. 5, 2005 in Japan are incorporated herein by reference.

Although the present invention has been described above by reference to two embodiments, the present invention is not limited to the two embodiments described above. Modifications and variations of the two embodiments described above will occur to those skilled in the art, in light of the above teachings.

Specifically, according to the first embodiment and the second embodiment of the present invention, the silicon carbide (SiC) is used for the semiconductor of the semiconductor substrate. The present invention is, however, not limited to this. Any of gallium nitride and diamond can replace the silicon carbide.

Moreover, according to the first embodiment and the second embodiment of the present invention, the polycrystal silicon is used for the semiconductor of the hetero semiconductor area 3. The present invention is, however, not limited to this. Any of single crystal silicon, amorphous silicon, germanium and gallium arsenide can replace the polycrystal silicon.

INDUSTRIAL APPLICABILITY

The method for producing the semiconductor device under the present invention can greatly decrease the interface level of the interface between the gate insulating film and the hetero semiconductor area and of the interface between the gate insulating film and the semiconductor substrate, thereby producing the semiconductor device 20 featuring low ON resistance and high voltage capability with low inverse leak current.

The scope of the present invention is defined with reference to the following claims.

The invention claimed is:

1. A method for producing a semiconductor device which includes:
   a semiconductor substrate,
   a hetero semiconductor area configured to contact a first main face of the semiconductor substrate and different from the semiconductor substrate in band gap,
   a gate electrode configured to contact, via a gate insulating film, a part of a junction part between the hetero semiconductor area and the semiconductor substrate,
   a source electrode configured to connect to the hetero semiconductor area,
   a drain electrode configured to make an ohmic connection with the semiconductor substrate, and
   a source drawing area formed on a shallow area of the surface of the hetero semiconductor area to exhibit a first electrical conductivity type different from a second electrical conductivity type of the hetero semiconductor area and to have a surface contact the source electrode,
   the method comprising the following sequential operations:
   forming the hetero semiconductor area on the first main face of the semiconductor substrate;
   forming the source drawing area formed on the shallow area of the surface of the hetero semiconductor area;
   etching a part of the hetero semiconductor area and the source drawing area;
   forming the gate insulating film on the hetero semiconductor area and the source drawing area that are etched and the semiconductor substrate that is exposed after etching; and
   nitriding the gate insulating film after having formed the gate insulating film, so as to decrease both an interface level of an interface defined between the gate insulating film and the semiconductor substrate and an interface level of an interface defined between the gate insulating film and the hetero semiconductor area with the source drawing area, while decreasing an interface level of an interface, which connects both the interface between the gate insulating film and the semiconductor substrate and the interface between the gate insulating film and the hetero semiconductor area with the source drawing area, defined between the semiconductor substrate and the hetero semiconductor area.

2. The method for producing the semiconductor device as claimed in claim 1, wherein the gate insulating film is formed through a depositing which is free from a heat oxidizing.

3. The method for producing the semiconductor device as claimed in claim 1, wherein the nitriding is a high temperature annealing in an atmosphere containing at least one selected from the group consisting of $N_2O$, NO and $NO_x$.

4. The method for producing the semiconductor device as claimed in claim 1, wherein
   the semiconductor substrate is made of at least one selected from the group consisting of silicon carbide, gallium nitride and diamond, and
   the hetero semiconductor area is made of at least one selected from the group consisting of single crystal silicon, polycrystal silicon, amorphous silicon, germanium and gallium arsenide.

5. The method for producing the semiconductor device as claimed in claim 3, wherein the high temperature annealing is implemented in the atmosphere at a temperature from 900° C. to 1,300° C. for several tens of minutes to several hours.

6. A semiconductor device, comprising:
   a semiconductor substrate;
   a hetero semiconductor area configured to contact a first main face of the semiconductor substrate and different from the semiconductor substrate in band gap;
   a source drawing area formed on a shallow area of the surface of the hetero semiconductor area exhibiting a first electrical conductivity type different from a second electrical conductivity type of the hetero semiconductor area;
   a gate insulating film produced by the following sequential operations:
   forming the hetero semiconductor area on the first main face of the semiconductor substrate;

forming the source drawing area formed on the shallow area of the surface of the hetero semiconductor area;

etching a part of the hetero semiconductor area and the source drawing area;

forming the gate insulating film on the hetero semiconductor area and the source drawing area that are etched and the semiconductor substrate that is exposed after etching; and nitriding the gate insulating film after having formed the gate insulating film, so as to decrease both an interface level of an interface defined between the gate insulating film and the semiconductor substrate and an interface level of an interface defined between the gate insulating film and the hetero semiconductor area with the source drawing area, while decreasing an interface level of an interface, which connects both the interface between the gate insulating film and the semiconductor substrate and the interface between the gate insulating film and the hetero semiconductor area with the source drawing area, defined between the semiconductor substrate and the hetero semiconductor area;

a gate electrode configured to contact, via the gate insulating film, a part of a junction part between the hetero semiconductor area and the semiconductor substrate;

a source electrode configured to connect to the hetero semiconductor area, with the source drawing area having a surface contact the source electrode, and a drain electrode configured to make an ohmic connection with the semiconductor substrate.

7. The method for producing the semiconductor device as claimed in claim 1, wherein an impurity diffusion area is formed in the hetero semiconductor area to connect with the source electrode via the source drawing area, while contacting the gate insulating film.

\* \* \* \* \*